United States Patent
Tong et al.

(10) Patent No.: US 10,498,370 B2
(45) Date of Patent: Dec. 3, 2019

(54) WIRELESSLY REFERENCED MULTI-OCTAVE OSCILLATOR

(71) Applicant: RAYTHEON COMPANY, Waltham, MA (US)

(72) Inventors: Tuan M. Tong, Frisco, TX (US); William K. Mcgehee, Mckinney, TX (US); Michael R. Patrizi, Allen, TX (US); Wesley W. Haswell, Sachse, TX (US)

(73) Assignee: Raytheon Company, Waltham, MA (US)

(*) Notice: Subject to any disclaimer, the term of this patent is extended or adjusted under 35 U.S.C. 154(b) by 192 days.

(21) Appl. No.: 15/652,193

(22) Filed: Jul. 17, 2017

(65) Prior Publication Data

US 2019/0020361 A1   Jan. 17, 2019

(51) Int. Cl.
| | | |
|---|---|---|
| *H04B 1/00* | (2006.01) | |
| *H03L 7/099* | (2006.01) | |
| *H03L 5/02* | (2006.01) | |
| *G01S 13/00* | (2006.01) | |
| *H03B 9/00* | (2006.01) | |
| *H03B 21/00* | (2006.01) | |

(Continued)

(52) U.S. Cl.
CPC .......... *H04B 1/0082* (2013.01); *G01S 13/003* (2013.01); *H03B 9/00* (2013.01); *H03B 21/00* (2013.01); *H03L 5/02* (2013.01); *H03L 7/08* (2013.01); *H03L 7/099* (2013.01); *H03L 7/24* (2013.01); *H04B 1/0053* (2013.01); *H04B 5/00* (2013.01); *F41G 7/007* (2013.01); *G01S 13/883* (2013.01); *H03L 1/00* (2013.01)

(58) Field of Classification Search
CPC .......... H03B 5/04; H03B 5/364; H03B 5/366; H03B 2200/004; H03B 2200/0068; H03B 2201/0208; H03B 2201/0266
See application file for complete search history.

(56) References Cited

U.S. PATENT DOCUMENTS

| | | | | |
|---|---|---|---|---|
| 4,398,196 A | * | 8/1983 | Wiegand | G01S 7/2921 342/13 |
| 5,418,536 A | * | 5/1995 | Lisle | G01S 13/5244 327/44 |

(Continued)

FOREIGN PATENT DOCUMENTS

| | | |
|---|---|---|
| CN | 105305963 A | 2/2016 |
| KR | 10-2016-0106522 A | 9/2016 |
| RU | 2 231 019 C2 | 6/2004 |

OTHER PUBLICATIONS

Ricketts, David S., et al., "A Self-Sustained Electrical Soliton Oscillator", IEEE, 2005, 4 pages.

(Continued)

*Primary Examiner* — Jeffrey M Shin
(74) *Attorney, Agent, or Firm* — Lewis Roca Rothgerber Christie LLP

(57) ABSTRACT

A signal source with a wireless frequency reference. A signal loop includes an amplifier and a coupler. The magnitude of the loop gain in the signal loop is substantially equal to 1 at a steady-state amplitude of a signal at a fundamental frequency. A reference oscillator is coupled to the loop through the coupler, via a wireless link, and provides phase stabilization. The loop may include a nonlinear transmission line, to generate a comb output spectrum.

18 Claims, 3 Drawing Sheets

(51) Int. Cl.
    *H04B 5/00*     (2006.01)
    *H03L 7/08*     (2006.01)
    *H03L 7/24*     (2006.01)
    *H03L 1/00*     (2006.01)
    *F41G 7/00*     (2006.01)
    *G01S 13/88*     (2006.01)

(56) References Cited

U.S. PATENT DOCUMENTS

| | | | |
|---|---|---|---|
| 6,681,868 B2 * | 1/2004 | Kovach | A01B 13/08 |
| | | | 172/146 |
| 8,878,575 B1 | 11/2014 | Blumke et al. | |
| 2007/0273454 A1 | 11/2007 | Pepper | |
| 2008/0169846 A1 | 7/2008 | Lan et al. | |
| 2014/0185635 A1 | 7/2014 | Cox et al. | |
| 2015/0162875 A1 | 6/2015 | Patrizi | |

OTHER PUBLICATIONS

International Search Report for corresponding International Application No. PCT/US2018/029982, filed Apr. 27, 2018, International Search Report dated Aug. 24, 2018 and dated Sep. 4, 2018 (5 pgs.).
Written Opinion of the International Searching Authority for corresponding International Application No. PCT/US2018/029982, filed Apr. 27, 2018, Written Opinion of the International Searching Authority dated Sep. 4, 2018 (7 pgs.).

\* cited by examiner

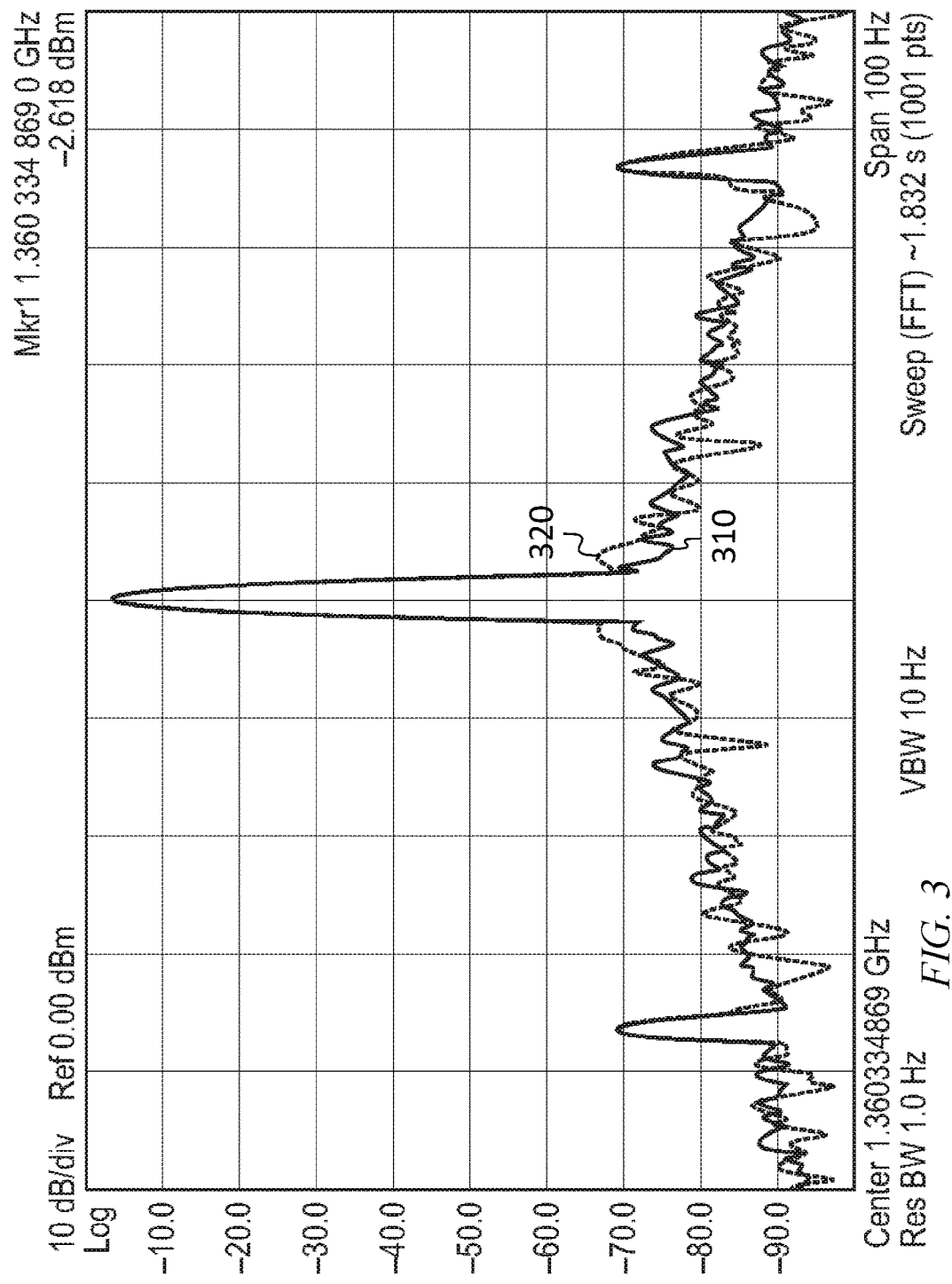

WIRELESSLY REFERENCED MULTI-OCTAVE OSCILLATOR

FIELD

One or more aspects of embodiments according to the present invention relate to signal sources, and more particularly to a signal source having a remote reference oscillator, connected to a self-oscillating loop of the signal source by a wireless link.

BACKGROUND

Systems using oscillators with low phase noise may on occasion be employed in mechanically noisy environments, e.g., environments with high acoustic noise and vibrations. In such an environment, a high quality reference oscillator, e.g., an oscillator using a mechanical resonator as a frequency reference, may experience performance degradation as a result of the mechanical noise.

Thus, there is a need for a system for generating a signal with low phase noise in a mechanically noisy environment.

SUMMARY

Aspects of embodiments of the present disclosure are directed toward a signal source with a wireless frequency reference. A signal loop includes an amplifier and a coupler. The magnitude of the loop gain in the signal loop is substantially equal to 1 at a steady-state amplitude of a signal at a fundamental frequency. A reference oscillator is coupled to the loop through the coupler, via a wireless link, and provides phase stabilization. The loop may include a nonlinear transmission line, to generate a comb output spectrum.

According to an embodiment of the present invention there is provided a signal source, including: a reference oscillator configured to generate a reference signal at a fundamental frequency at a reference oscillator output; a transmitting antenna, connected to the reference oscillator output; a signal loop including a first amplifier, the signal loop having a loop gain magnitude substantially equal to 1 at a steady-state amplitude of a fundamental frequency; a coupler for coupling a signal into the signal loop; and a receiving antenna connected to the coupler, and configured to receive electromagnetic radiation transmitted by the transmitting antenna; the signal source being configured to cause a circulating signal in the signal loop, at the fundamental frequency, to be phase-stabilized to the reference oscillator.

In one embodiment, the signal includes a tone at the fundamental frequency and a tone at a harmonic of the fundamental frequency, the frequency of the tone at the harmonic of the fundamental frequency being at least 4 times the fundamental frequency, and the amplitude of the tone at the harmonic of the fundamental frequency being at least 0.01 of the amplitude of the tone at the fundamental frequency.

In one embodiment, the comb generator is a nonlinear transmission line.

In one embodiment, the signal loop further includes a band-pass filter, having a pass-band encompassing the fundamental frequency.

In one embodiment, the signal loop has a loop gain magnitude less than 0.95 for all harmonics of the fundamental frequency.

In one embodiment, the reference oscillator is a crystal oscillator.

In one embodiment, the signal loop further includes a discrete phase shifter.

In one embodiment, the phase shifter is adjustable through a range of at least 5 degrees.

In one embodiment, the signal loop further includes a second amplifier.

According to an embodiment of the present invention there is provided a system having a first equipment mount and a second equipment mount and including a signal source, the signal source including: a reference oscillator configured to generate a reference signal at a fundamental frequency at a reference oscillator output; a transmitting antenna, connected to the reference oscillator output; a signal loop including a first amplifier, the signal loop having a loop gain magnitude substantially equal to 1 at a steady-state amplitude of a fundamental frequency; a coupler for coupling a signal into the signal loop; and a receiving antenna connected to the coupler, and configured to receive electromagnetic radiation transmitted by the transmitting antenna; the signal source being configured to cause a circulating signal in the signal loop, at the fundamental frequency, to be phase-stabilized to the reference oscillator, the signal source being secured to the first equipment mount, the reference oscillator being secured to the second equipment mount, wherein the system is configured to operate with a motion spectrum having root mean squared motion, in a frequency range from 1000 Hz to 100 kHz, at least 30 dB greater at the first equipment mount than at the second equipment mount.

In one embodiment, the signal includes a tone at the fundamental frequency and a tone at a harmonic of the fundamental frequency, the frequency of the tone at the harmonic of the fundamental frequency being at least 4 times the fundamental frequency, and the amplitude of the tone at the harmonic of the fundamental frequency being at least 0.01 of the amplitude of the tone at the fundamental frequency.

In one embodiment, the comb generator is a nonlinear transmission line.

In one embodiment, the signal loop further includes a band-pass filter, having a pass-band encompassing the fundamental frequency.

In one embodiment, the signal loop has a loop gain magnitude less than 0.95 for all harmonics of the fundamental frequency.

In one embodiment, the reference oscillator is a crystal oscillator.

In one embodiment, the signal loop further includes a discrete phase shifter.

In one embodiment, the phase shifter is adjustable through a range of at least 5 degrees.

In one embodiment, the signal loop further includes a second amplifier.

BRIEF DESCRIPTION OF THE DRAWINGS

Features, aspects, and embodiments are described in conjunction with the attached drawings, in which:

FIG. 3 is a graph of two power spectra, according to an embodiment of the present invention.

DETAILED DESCRIPTION

The detailed description set forth below in connection with the appended drawings is intended as a description of exemplary embodiments of a wirelessly referenced multi-octave oscillator provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
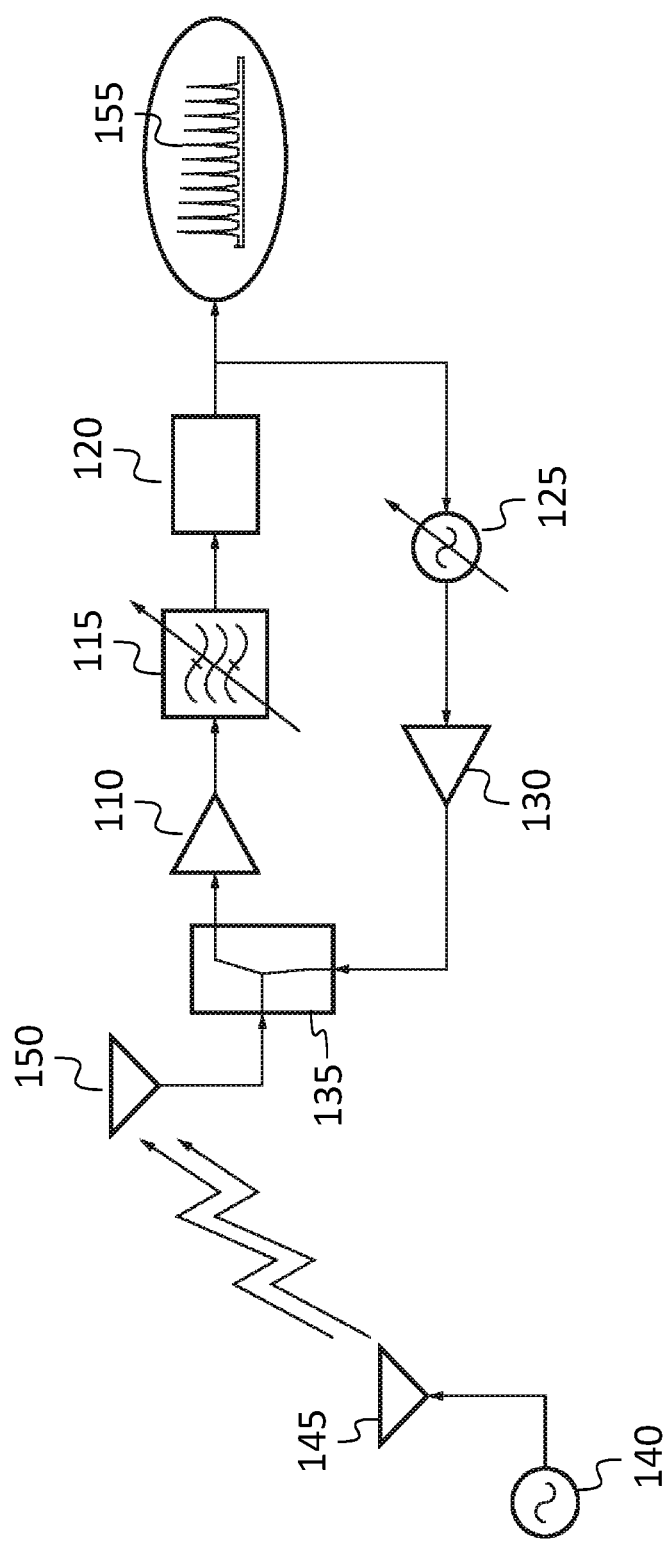
FIG. 1 is a block diagram of a signal source, according to an embodiment of the present invention.

Referring to FIG. 1, in some embodiments, a first oscillator, referred to herein as a "self-oscillating loop" includes a signal loop around which electrical signals may propagate. The loop includes a first amplifier 110, a band-pass filter 115, a nonlinear transmission line 120, a phase shifter 125, a second amplifier 130 and a coupler 135. The components are selected so that a small amplitude signal at a natural frequency, e.g., at 1.28 GHz, experiences a gain, upon propagating around the loop once, having a magnitude greater than 1, and a phase change of 0 (modulo 2 pi). The bandpass filter 115 may be constructed, in some embodiments, as a cascade connection of a low-pass filter and a high-pass filter. In some embodiments a comb generator different from a nonlinear transmission line, such as a step recovery diode (SRD), may be used. Accordingly, such a signal (which may have its initial origins in noise in one or more of the components) may grow (e.g., exponentially) with time. Some of the elements of the signal loop (e.g., the amplifiers 110, 130 and the nonlinear transmission line 120, may be non-linear and may exhibit amplitude dependent gain, so that when the signal at the natural frequency increases in amplitude to a certain steady-state value, the magnitude of the gain around the loop, or "loop gain magnitude" may decrease to be substantially equal to 1. The loop gain magnitude may differ from 1 slightly, for example because of noise in the loop (which may on occasion contribute additively to the signal and result in a loop gain magnitude that is accordingly less than 1), or because of other factors, such as fluctuations in power supply voltage, that may result in small, transient changes in the loop gain magnitude. The amplitude of the signal may generally, aside from such fluctuations, remain at the steady-state value. The quality factor of the signal loop may be relatively low, and noise (e.g., in the amplifiers 110, 130) may be significant, so that the spectral purity (e.g., the phase stability) of the signal generated by the self-oscillating loop may be inadequate for some applications.

A reference oscillator 140 may be used with the self-oscillating loop to form an oscillator having superior performance (e.g., higher phase stability). The reference oscillator may for example be a crystal oscillator, or a crystal oscillator with a frequency multiplier (e.g., with a multiplying phase-locked loop). The signal from the reference oscillator 140 may be coupled into the signal loop through the coupler 135, and may improve performance of the self-oscillating loop, e.g., through the mechanism of injection locking.

The reference oscillator 140 may be relatively sensitive to vibrations. For example, if the reference oscillator 140 is or includes a crystal oscillator, then a mechanical vibrational mode of the crystal may serve as the frequency reference. External mechanical disturbances (e.g., vibrations) may couple to the vibration of the crystal, resulting in phase changes in the vibrations of the crystal, and corresponding phase fluctuations at the output of the reference oscillator 140. Accordingly, it may be advantageous to operate the reference oscillator 140 in a mechanically quiet environment.

In some systems, it may be advantageous to install the reference oscillator 140 at a location that is at some distance from the self-oscillating loop. For example, in some systems, as discussed in further detail below, various installation points for equipment, or "equipment mounts", may be available, with different respective constraints and environments. In some situations, a mechanically noisy installation point may be an advantageous installation point for the self-oscillating loop, and the nearest mechanically quiet installation point may be at some distance from the installation point that is well suited for the self-oscillating loop, or for other reasons it may be inconvenient to provide a conductive connection suitable for carrying the signal from the reference oscillator 140 between the two installation points.

In such a situation, the signal from the reference oscillator may be conveyed to the coupler 135 over a signal path a portion of which is a wireless link, as illustrated in FIG. 1. A transmitting antenna 145 may be connected to the reference oscillator 140, and a receiving antenna 150 may be connected to the coupler 135. The transmitting antenna 145 may be coupled to the receiving antenna by free-space electromagnetic radiation transmitted from the transmitting antenna 145 to the receiving antenna 150; accordingly the signal from the reference oscillator 140 may propagate to the transmitting antenna 145, to the receiving antenna 150, and into the signal loop through the coupler 135.

In some embodiments, because of the effects of the nonlinear transmission line 120, the self-oscillating loop operates as a comb generator. The nonlinear transmission line 120 may have nonlinear characteristics that cause it to produce, at its output, a plurality of harmonics of the signal at its input. The amplitudes, at the output of the nonlinear transmission line 120, of some of the harmonics and of the fundamental, may be comparable, so that the spectrum 155 of the output of the nonlinear transmission line 120, and at the output of the signal source, has the shape of a comb. For example, the output may have a spectrum that includes tones at the fundamental frequency and at 10 harmonics, with the amplitude of the largest of these 11 tones differing from the amplitude of the smallest of these tones by no more than 10 dB. The tones (i.e., the fundamental and the harmonics) in the output of the signal source may be phase coherent with each other, so that a system (e.g., a radar system), in which the signal source is used, may be able to switch between the tones and retain phase memory while doing so. The fundamental frequency may be the natural frequency of the self-oscillating loop when the reference signal is absent, or it may be the frequency of the reference oscillator when the reference signal is present and the self-oscillating loop is locked (e.g., by injection locking) to the reference signal.

Figure 2:
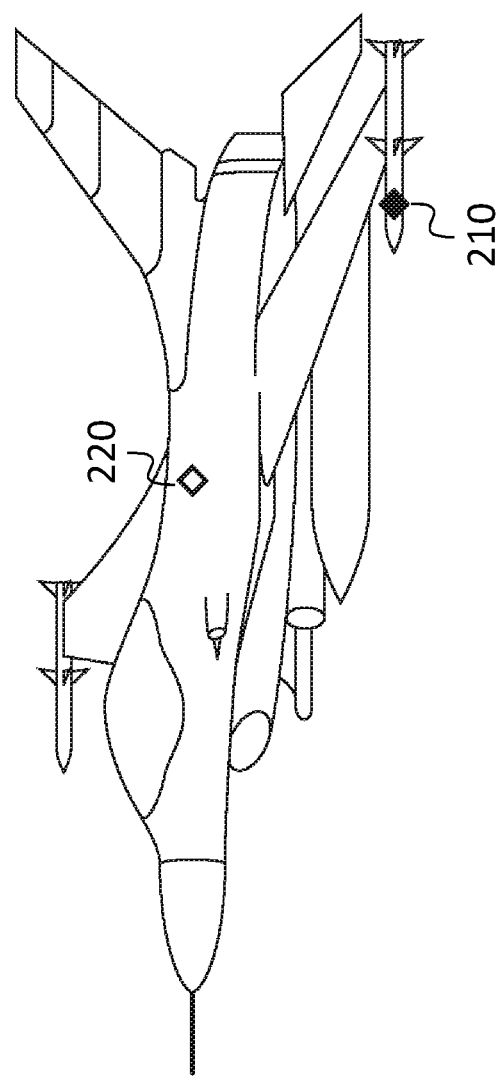
FIG. 2 is an equipment location diagram, according to an embodiment of the present invention.

Referring to FIG. 2, in some embodiments, a system such as an aircraft may have, as mentioned above, a mechanically noisy installation point 210 and a mechanically quiet installation point 220. For example, as illustrated, a wing-mounted missile may have an installation point at which contributions from aircraft engine vibrations and wind create a significant amount of vibration. The missile may include a radar system including a self-oscillating loop according to embodiments of the present invention. The mechanically noisy installation point 210 may be poorly suited, because of its vibration environment, for the reference oscillator 140, the performance of which may be unacceptably degraded if operated in the environment of the mechanically noisy installation point 210.

In other embodiments, in a mechanically noisy environment the reference oscillator 140 may be on a vibration-isolated platform to isolate it from mechanical vibrations of the environment, and the self-oscillating loop may installed at a mechanically noisier installation point (e.g., not on the vibration-isolated platform). In such a situation it may be advantageous to connect the reference oscillator 140 to the self-oscillating loop with a wireless link, to avoid the use of a cable between the reference oscillator 140 and the self-oscillating loop, which, if present, could transmit mechanical vibrations to the reference oscillator 140. In such a situation the use of a wireless link may be beneficial even if the reference oscillator 140 is in close proximity to the self-oscillating loop.

The mechanically quiet installation point 220 may be in the fuselage of the aircraft and it may be mechanically quiet as a result of the attenuating effects of the relatively high mass and stiffness of the fuselage; moreover, there may be sufficient space in the fuselage for a vibration isolation system providing further attenuation of mechanical disturbances. Accordingly, the mechanically quiet installation point 220 may be a suitable installation point for the reference oscillator 140. In some systems, the mechanically quiet installation point used to secure the reference oscillator 140 may have a root mean squared motion, in a frequency range from 1000 Hz to 100 kHz, that is at least 30 dB less than the root mean squared motion, over the same frequency range, of the mechanically noisy installation point.

It may be disadvantageous, however, or impractical, to provide a conductive connection, e.g., a coaxial cable, between the mechanically quiet installation point 220 and the mechanically noisy installation point 210 to carry the signal from the reference oscillator 140 to the self-oscillating loop. For example, the mass of such a cable may be undesirable, or a suitable passageway may not exist within the wing, or it may be impractical to provide a release mechanism for disconnecting the cable when the missile is launched. A wireless link may therefore be used to carry the signal from the reference oscillator 140 to the self-oscillating loop.

In some embodiments the wireless link is protected from jamming and/or detection by one or more of several methods. For example, because the link is used as a point-to-point connection (and not as a broadcast link), highly directional antennas may be employed to reduce the likelihood of both jamming and detection. In some circumstances, such as those illustrated in FIG. 2, shielding (e.g., the metal skin of an aircraft wing) may be available to reduce egress and ingress of radiation, or a Faraday cage may be provided for the same purpose.

In some embodiments the fundamental frequency is a microwave frequency between 1 GHz and 10 GHz, e.g., 1.28 GHz. The band-pass filter 115 may be fixed or tunable, and may have a frequency response that ensures that only the fundamental frequency has a loop gain magnitude exceeding, or substantially equal to 1 (i.e., experiences a gain, during one trip around the signal loop, having a magnitude greater than or substantially equal to 1). The filter may ensure, or help to ensure (e.g., together with frequency-dependent gain in the amplifiers), that each harmonic experiences a loop gain magnitude less than 0.95. In some embodiments the band-pass filter 115 is a lumped element (e.g., LC) filter or a distributed element filter (e.g., a microstrip filter), and has a bandwidth of between 1 MHz and 100 MHz, or, in some embodiments, about 10 MHz.

The nonlinear transmission line 120 may be a model MLPNC-7103S1 nonlinear transmission line comb generator available from MACOM™ (www.macom.com). The nonlinear transmission line 120 may produce an acceptable comb spectrum for input power greater than 15 dBm, or, in some embodiments, for input power in the range between 18 dBm and 24 dBm. Accordingly, the amplifiers 110, 130 may be selected to provide a total gain, at the fundamental frequency, that cancels the losses of the other elements, including the nonlinear transmission line 120, at the steady state amplitude of the fundamental frequency signal. The nonlinear transmission line 120 may have significant loss at the fundamental frequency as a result of converting power at the fundamental frequency into power in the harmonics. In some embodiments each of the amplifiers 110, 130 has a gain of about 20 dB.

The phase shifter 125 may be a discrete element or a distributed element (e.g., a transmission line). It may be fixed or adjustable. An adjustable phase shifter may be manually adjustable (e.g., it may include a twisted pair capacitor that may be adjusted by trimming the length of the pair of wires) or it may be electronically adjustable (e.g., including a varactor, the capacitance of which varies with bias). The phase shifter may be used in manufacturing, to compensate for variations in the phase delays introduced by other elements in the signal loop, as a result of manufacturing variability. The phase shifter may be adjusted, during construction, by operating the self-oscillating loop with the reference oscillator 140 turned off, and adjusting the phase until the fundamental frequency (e.g., observed using a spectrum analyzer) is within a set range of the target frequency (e.g., of the nominal frequency of the reference oscillator 140). In some embodiments the phase shifter is adjustable through a range of at least 5 degrees of phase.

FIG. 3 shows, in a first curve 310, the spectrum of the reference oscillator, and in a second curve 320, the spectrum at the output of the self-oscillating loop when the self-oscillating loop is phase-stabilized to the reference oscillator. It can be seen that the phase noise of the self-oscillating loop differs only slightly from that of the reference oscillator.

Example

In one exemplary embodiment, the coupler 135 is an Anaren model 10040-3 hybrid coupler, the phase shifter 125 is an Aeroflex/Weinschel 890-2 phase shifter, each of the amplifiers 110, 130 is an RFMD model SBB5089Z InGaP HBT MMIC amplifier, the power divider at the output of the nonlinear transmission line 120 is a Mini-Circuits model ZFRSC-183-S+ power splitter/combiner, and the nonlinear transmission line is a Macom model MLPNC-7103S1 nonlinear transmission line comb generator.

Each of the amplifiers 110, 130 may have an output $3^{rd}$ order intercept point (OIP3) of 38.5 dBm and gain of 20.5 dB. The phase shifter 125 may be a miniature in-line phase shifter that provides linear adjustable phase shift from DC to 18 GHz. The phase shifter may use a mechanical twist to provide 0.5 degrees per turn per GHz. The adjustment shaft may have 20 turns for full range. The insertion loss of the phase shifter 125 may be 0.8 dB. The coupler 135 may be a hybrid, 3 dB, 90 degree coupler, with a frequency range of 1.4 GHz to 2.8 GHz, insertion loss of 0.3 dB, and isolation of 20 dB. The nonlinear transmission line may be a monolithic nonlinear transmission line comb generator, with a variable input frequency of 600 MHz-1500 MHz, variable input power in the range 19 dBm-24 dBm, and configured to generate output harmonics to 30 GHz.

Although limited embodiments of a wirelessly referenced multi-octave oscillator have been specifically described and illustrated herein, many modifications and variations will be apparent to those skilled in the art. Accordingly, it is to be understood that a wirelessly referenced multi-octave oscillator employed according to principles of this invention may be embodied other than as specifically described herein. The invention is also defined in the following claims, and equivalents thereof.

What is claimed is:

1. A signal source, comprising:
   a reference oscillator configured to generate a reference signal at a fundamental frequency at a reference oscillator output;
   a transmitting antenna, connected to the reference oscillator output;
   a signal loop comprising a first amplifier, the signal loop having a loop gain magnitude substantially equal to 1 at a steady-state amplitude of a fundamental frequency;
   a coupler for coupling a signal into the signal loop; and
   a receiving antenna connected to the coupler, and configured to receive electromagnetic radiation transmitted by the transmitting antenna;
   the signal source being configured to cause a circulating signal in the signal loop, at the fundamental frequency, to be phase-stabilized to the reference oscillator by injection locking.

2. The signal source of claim 1, wherein the signal loop further comprises a comb generator and the signal loop is configured to generate, at an output of the comb generator, a plurality of tones including a tone at the fundamental frequency and a tone at a harmonic of the fundamental frequency, the frequency of the tone at the harmonic of the fundamental frequency being at least 4 times the fundamental frequency, and the amplitude of the tone at the harmonic of the fundamental frequency being at least 0.01 of the amplitude of the tone at the fundamental frequency.

3. The signal source of claim 2, wherein the comb generator is a nonlinear transmission line.

4. The signal source of claim 2, wherein the signal loop further comprises a band-pass filter, having a pass-band encompassing the fundamental frequency.

5. The signal source of claim 4, wherein the signal loop has a loop gain magnitude less than 0.95 for all harmonics of the fundamental frequency.

6. The signal source of claim 1, wherein the reference oscillator is a crystal oscillator.

7. The signal source of claim 1, wherein the signal loop further comprises a discrete phase shifter.

8. The signal source of claim 7, wherein the phase shifter is adjustable through a range of at least 5 degrees.

9. The signal source of claim 1, wherein the signal loop further comprises a second amplifier.

10. A system having a first equipment mount and a second equipment mount and comprising a signal source, the signal source comprising:
    a reference oscillator configured to generate a reference signal at a fundamental frequency at a reference oscillator output;
    a transmitting antenna, connected to the reference oscillator output;
    a signal loop comprising a first amplifier, the signal loop having a loop gain magnitude substantially equal to 1 at a steady-state amplitude of a fundamental frequency;
    a coupler for coupling a signal into the signal loop; and
    a receiving antenna connected to the coupler, and configured to receive electromagnetic radiation transmitted by the transmitting antenna;
    the signal source being configured to cause a circulating signal in the signal loop, at the fundamental frequency, to be phase-stabilized to the reference oscillator,
    the signal source being secured to the first equipment mount,
    the reference oscillator being secured to the second equipment mount,
    wherein the system is configured to operate with a motion spectrum having root mean squared motion, in a frequency range from 1000 Hz to 100 kHz, at least 30 dB greater at the first equipment mount than at the second equipment mount.

11. The signal source of claim 10, wherein the signal loop further comprises a comb generator and the signal loop is configured to generate, at an output of the comb generator, a plurality of tones including a tone at the fundamental frequency and a tone at a harmonic of the fundamental frequency, the frequency of the tone at the harmonic of the fundamental frequency being at least 4 times the fundamental frequency, and the amplitude of the tone at the harmonic of the fundamental frequency being at least 0.01 of the amplitude of the tone at the fundamental frequency.

12. The signal source of claim 11, wherein the comb generator is a nonlinear transmission line.

13. The signal source of claim 11, wherein the signal loop further comprises a band-pass filter, having a pass-band encompassing the fundamental frequency.

14. The signal source of claim 13, wherein the signal loop has a loop gain magnitude less than 0.95 for all harmonics of the fundamental frequency.

15. The signal source of claim 10, wherein the reference oscillator is a crystal oscillator.

16. The signal source of claim 10, wherein the signal loop further comprises a discrete phase shifter.

17. The signal source of claim 16, wherein the phase shifter is adjustable through a range of at least 5 degrees.

18. The signal source of claim 10, wherein the signal loop further comprises a second amplifier.

* * * * *